United States Patent [19]
Mouri et al.

[11] Patent Number: 6,147,006
[45] Date of Patent: Nov. 14, 2000

[54] CLEANING GAS

[75] Inventors: Isamu Mouri; Tetsuya Tamura; Mitsuya Ohashi; Tadayuki Kawashima, all of Saitama, Japan

[73] Assignee: Central Glass Company, Limited, Ube, Japan

[21] Appl. No.: 09/479,057

[22] Filed: Jan. 7, 2000

[30] Foreign Application Priority Data

Jan. 12, 1999 [JP] Japan .................................. 11-004809
Oct. 12, 1999 [JP] Japan .................................. 11-289190

[51] Int. Cl.[7] .................................................. H01L 21/302
[52] U.S. Cl. .......................... 438/706; 438/905; 510/188; 510/245; 510/382; 216/58; 216/104
[58] Field of Search ..................... 510/188, 245, 510/382; 438/905, 706; 216/104, 58

[56] References Cited

U.S. PATENT DOCUMENTS 5,679,215  10/1997  Barnes et al. ...................... 156/646.1
6,043,162   3/2000  Shimizu et al. ........................ 438/706

*Primary Examiner*—Yogendra Gupta
*Assistant Examiner*—Derrick G. Hamlin
*Attorney, Agent, or Firm*—Evenson, McKeown, Edwards & Lenahan, P.L.L.C.

[57] ABSTRACT

A cleaning gas which is employed to remove an unnecessary deposited material formed in a thin film forming apparatus by thermal decomposition of pentaethoxytantalum or tetraethoxysilane without damaging a reactor, tools, parts and piping of a silicon oxide film-forming apparatus or a tantalum oxide film-forming apparatus. The cleaning gas comprises HF gas and at least one of an oxygen-containing gas, a fluorine gas, a chlorine fluoride gas, a bromine fluoride gas and an iodine fluoride gas.

8 Claims, No Drawings

CLEANING GAS

BACKGROUND OF THE INVENTION

The present invention relates a cleaning gas for removing a polymer of tetraethoxysilane or pentaethoxytantalum without damaging a reactor, tools, parts and piping of a silicon oxide film-forming apparatus or a tantalum oxide film-forming apparatus in which tetraethoxyethane or pentaethoxytantalum is used as a starting material.

When a silicon oxide film or a tantalum oxide film is deposited by a CVD (Chemical Vapor Deposition) using tetraethoxysilane (TEOS) or pentaethoxytantalum (PETa) as a starting material, a compound or polymer containing C, H and O in addition to Si and Ta is deposited at an inner wall, tools, parts and piping of the apparatus. Due to formation of these compounds, particles are formed in the reactor or clogging of the piping is occurred. Accordingly, it is necessary to remove these deposited materials at any time.

As a method for removing these deposits, it has generally been used a method of removing them by disassembling apparatus and piping. Also, the inventors of the present invention have disclosed a cleaning method using a HF gas in a Japanese Patent Provisional Application No. 5-214339. This method has arranged to rapidly react and remove polymers such as tetraethoxysilane without disassembling the apparatus and piping, or effecting removal of tools. More specifically, this method functions to remove the deposit without liquefying $H_2O$ which is a reaction product at the time of cleaning, i.e., without causing formation of hydrofluoric acid by controlling a gas temperature and a HF gas concentration. However, if a deposition amount of polymer becomes extremely large, for example, when a flow rate of TEOS which is a starting material for increasing a deposition rate of a silicon oxide film is increased, it becomes difficult to precisely control a gas temperature at the inside of a reactor or in a piping. Thus, when a material containing C, H and O with high contents is adhered thereon with a large amount or when a liquid-state polymer exists thereon, corrosion of metal materials may be occurred by formation of hydrofluoric acid. Accordingly, it has been desired a gas or a method which can effect cleaning without requiring precise control of the temperature or the HF gas concentration or without causing metal corrosion by hydrofluoric acid.

Further, the inventors of the present invention have disclosed a method in which oxygen is firstly introduced into the system to oxidize a TEOS decomposed material, then cleaning is carried out by a HF gas, in a Japanese Patent Provisional Application No. 9-129586. However, in such a method, an $O_2$ treatment and a HF treatment should be carried out with two steps so that it is not effective. Also, regarding a decomposed material of pentaethoxytantalum, a method of removing it with $ClF_3$ or $F_2$ has been disclosed in Japanese Patent Provisional Publication No. 9-301718. However, the method uses an active fluorinating agent so that there was a possibility of causing combustion by a large amount of $ClF_3$, etc. due to trouble of a mass flow controller or trouble of a vacuum pump or a pressure control valve, or when $ClF_3$, etc. is flowed in a system with a high pressure. Also, with regard to TEOS, as for a mixed gas for HF and $ClF_3$, it is disclosed in Japanese Patent Provisional Publication No. 6-173012.

SUMMARY OF THE INVENTION

It is therefore an object of the present invention to provide a cleaning gas by which an unnecessary deposited material formed in a thin film forming apparatus by thermal decomposition of alkoxide is removed without damaging a reactor, tools, parts and piping of a silicon oxide film-forming apparatus or a tantalum oxide film-forming apparatus.

A cleaning gas according to the present invention is for removing an accumulated material formed on an inner surface of a thin film forming apparatus by thermal decomposition of alkoxide. The cleaning gas comprises HF gas and at least one of an oxygen-containing gas, a fluorine gas, a chlorine fluoride gas, a bromine fluoride gas and an iodine fluoride gas.

More specifically, the cleaning gas is for removing an accumulated material formed on an inner surface of a thin film forming apparatus by thermal decomposition of pentaethoxytantalum. The cleaning gas comprises HF gas and at least one of an oxygen-containing gas, a fluorine gas, a chlorine fluoride gas, a bromine fluoride gas and an iodine fluoride gas.

Furthermore, the cleaning gas is for removing an accumulated material formed on an inner surface of a thin film forming apparatus by thermal decomposition of tetraethoxysilane. The cleaning gas comprises HF gas and at least one of an oxygen-containing gas, a fluorine gas, a bromine fluoride gas and an iodine fluoride gas.

DETAILED DESCRIPTION OF THE INVENTION

As a result of intensive studies, the present inventors have found a composition of a cleaning gas by which a decomposed material including polymers of alkoxide is efficiently and safety removed. The cleaning gas is a mixed gas containing a HF gas and at least one of an oxygen-containing gas, a fluorine gas, a chlorine fluoride gas, a bromine fluoride gas or an iodine fluoride gas.

That is, the present invention relates to a gas for removing an unnecessary deposited material formed in a thin film forming apparatus by thermal decomposition of pentaethoxytantalum (PETa), and provide a cleaning gas which contains HF and at least one of an oxygen-containing gas, a fluorine gas or a fluorine series inter halogen gas. Furthermore, the present invention relates to a gas for removing an unnecessary deposited material formed in a thin film forming apparatus by thermal decomposition of tetraethoxysilane (TEOS), and provide a cleaning gas which contains HF and at least one of an oxygen-containing gas, a fluorine gas or a fluorine series inter halogen gas.

A substance, which becomes an object of the gas of the present invention, is a composition of $(SiC_xH_yO_z)n$ [X=0.1 to 8, Y=1 to 20, Z=0.1 to 11, and n>0] when the decomposed product composition formed by thermal decomposition of the alkoxide is TEOS, and the substance is a composition of $(TaC_xH_yO_z)n$ [X=0.1 to 10, Y=1 to 25, Z=0.1 to 11, and n>0] when it is PETa.

Also, the oxygen-containing gas to be used in the present invention is $O_2$, $O_3$, $N_2O$, NO or CO and chlorine fluoride represents ClF, $ClF_3$ or $ClF_5$, bromine fluoride represents BrF, $BrF_3$ or $BrF_5$, and iodine fluoride represents IF, $IF_3$, $IF_5$ or $IF_7$.

When an oxygen-containing gas is employed in the cleaning gas according to the present invention, oxidation of an alkoxide polymerized material is promoted and an amount of vapor formed by the reaction is reduced by the mixed oxygen whereby corrosion of metal can be controlled and the metal is fluorinated by HF gas whereby an unnecessary deposited material can be reacted and removed.

Further, when the oxygen-containing gas such as $O_2$, $O_3$, $N_2O$, NO or CO is employed in the cleaning gas according to the present invention, the gas concentration of the oxygen-containing gas is preferably in the range of 5 to 80%, and the HF gas concentration is preferably in the range of 10 to 95%. If the concentration of the oxygen-containing gas is less than the above concentration range, oxidation-promoting effect of the deposited material cannot sufficiently be obtained. Also, if the HF gas concentration is less than the above concentration range, an oxidation effect due to the oxygen-containing gas is superior to an etching effect due to HF so that there is a problem that the cleaning takes much more time. Also, if the oxygen-containing gas concentration exceeds 80%, oxidation undesirably proceeds, and if the HF gas concentration exceeds 95%, a steam-generated amount per a unit time undesirably becomes too much.

The ambient temperature during the cleaning is preferably in the range of 20 to 200° C., most suitably in the range of 50 to 150° C. If it is less than 20° C., there is a possibility of undesirably liquefying HF in the piping, while if it exceeds 200° C., a resin such as an O-ring to be used in the piping is undesirably damaged.

Also, in the present invention when fluorine, chloride fluoride, bromine fluoride or iodine fluoride is employed, it is necessary to maintain the concentration of the employed gas smaller than or equal to 20%. If it exceeds 20%, $SiO_2$ or $Ta_2O_5$ generates in powder state to increase a particle amount in the reactor or the apparatus is broken by the deposition of powder in a pump or in a valve, which are considered to be caused by burning the alkoxide polymer. Also, if it is less than 0.1%, the oxidation effect to the decomposed material cannot sufficiently be obtained. The HF gas concentration is preferably in the range of 5 to 99.9%. If it is less than 5%, a sufficient cleaning effect cannot desirably be obtained.

The ambient temperature during the cleaning is preferably in the range of 20 to 200° C., most suitably in the range of 50 to 150° C. If it is less than 20° C., there is a possibility of undesirably liquefying HF in the piping, while if it exceeds 200° C., a resin such as an O-ring to be used in the piping is undesirably damaged. Moreover, corrosion of metals is sometimes undesirably caused due to $ClF_3$, etc.

In the present invention, an inert gas such as Ar, He, $N_2$ and $CO_2$ may be mixed as a third component of the cleaning gas.

EXAMPLES

In the following, the present invention is explained more specifically by referring to Examples. Further, it will be understood that the present invention will not be limited by such Examples.

Examples 1 to 6, Comparative Examples 1 and 2

In an exhaust series piping and at a flange portion of a reactor of an apparatus in which thermal CVD (a flow rate: 3SLM, 450° C., 760 Torr) was carried out using TEOS as a starting material, a transparent glass state substance (deposited film thickness; about 5 mm) containing a liquid-state alkoxide polymerized material was adhered. As a result of an elemental analysis, the composition was $SiC_{0.8}H_6O_9$. This piping portion was detached, and a gas supplying series and a gas exhausting series piping were newly attached to the piping. A mixed gas of $O_2$ and HF was flowed with a whole pressure of 760 Torr for one hour to effect cleaning. Observed result in the piping after cleaning are shown in Table 1. Provided that as for example in which total concentration of HF and $O_2$ in Table 1 was less than 100%, Ar was used as a diluting gas. Also, when the oxygen-containing gas had been changed to $O_3$, $N_2O$, NO or CO, the same results were obtained.

[TABLE 1]

|  | O2 flow rate (SCCM) | O2 concentration (vol %) | HF flow rate (SCCM) | HF concentration (vol %) | Pressure (Torr) | Observed results at the inner portion of piping |
|---|---|---|---|---|---|---|
| Example 1 | 50 | 5 | 950 | 95 | 100 | Accumulated material completely removed to no metal corrosion |
| Example 2 | 200 | 20 | 800 | 80 | 100 | Same results as in Example 1 |
| Example 3 | 800 | 80 | 200 | 20 | 100 | Same as in Example 1 |
| Example 4 | 800 | 80 | 100 | 10 | 100 | Same as in Example 1 |
| Example 5 | 800 | 80 | 100 | 10 | 760 | Same as in Example 1 |
| Example 6 | 800 | 80 | 100 | 10 | 5 | Same as in Example 1 |
| Comparative Example 1 | 10 | 1 | 900 | 90 | 100 | Liquid drop of hydrofluoric acid residual liquid adhered portion in piping corroded |
| Comparative Example 1 | 900 | 90 | 100 | 10 | 100 | White colored cleaning residue (SiO2) remained |

Examples 7 to 12, Comparative Examples 3 and 4

In an exhaust series piping and at a flange portion of a reactor of an apparatus in which thermal CVD (a flow rate: 3SLM, 550° C., 760 Torr) was carried out using PETa as a starting material, a transparent glass state substance (deposited film thickness; about 5 mm) containing a liquid-state alkoxide polymerized material was adhered. As a result of an elemental analysis, the composition was $TaC_{0.2}H_8O_{10}$. This piping portion was detached, and a gas supplying series and a gas exhausting series piping were newly attached to the piping. A mixed gas of $O_2$ and HF was flowed with a whole pressure of 760 Torr for one hour to effect cleaning. Observed results in the piping after cleaning were shown in Table 2. Provided that as for example in which total concentration of HF and $O_2$ in Table 2 was less than 100%, Ar was used as a diluting gas. Also, when the oxygen-containing gas had been changed to $O_3$, $N_2O$, NO, CO, the same results were obtained.

Examples 13 to 15, Comparative Example 5

In an exhaust series piping and at a flange portion of a reactor of an apparatus in which thermal CVD (a flow rate: 3SLM, 450° C., 760 Torr) was carried out using TEOS as a starting material, a transparent glass-state substance (deposited film thickness; about 5 mm) containing liquid-state alkoxide polymerized material was adhered. As a result of an elemental analysis, the composition was $SiC_{0.8}H_6O_9$. This piping portion was detached, and a gas supplying series and a gas exhausting series piping were newly attached to said piping. A mixed gas of $BrF_5$ and HF was flowed with a whole pressure of 760 Torr for one hour to effect cleaning. Observed results in the piping after cleaning are shown in Table 3. Also, when the $BrF_5$ gas had been changed to $F_2$, $BrF_5$, or $IF_7$, the same results were obtained.

[TABLE 2]

| | O2 flow rate (SCCM) | O2 concentration (vol %) | HF flow rate (SCCM) | HF concentration (vol %) | Pressure (Torr) | Observed results at the inner portion of piping |
|---|---|---|---|---|---|---|
| Example 7 | 50 | 5 | 950 | 95 | 100 | Accumulated material completely removed to no metal corrosion |
| Example 8 | 200 | 20 | 800 | 80 | 100 | Same results as in Example 7 |
| Example 9 | 800 | 80 | 200 | 20 | 100 | Same as in Example 7 |
| Example 10 | 800 | 80 | 100 | 10 | 100 | Same as in Example 7 |
| Example 11 | 800 | 80 | 100 | 10 | 760 | Same as in Example 7 |
| Example 12 | 800 | 80 | 100 | 10 | 5 | Same as in Example 7 |
| Comparative Example 3 | 10 | 1 | 900 | 90 | 100 | Liquid drop of hydrofluoric acid residual liquid adhered portion in piping corroded |
| Comparative Example 4 | 900 | 90 | 100 | 10 | 100 | White colored cleaning residue (SiO2) remained |

[TABLE 3]

| | BrF5 flow rate (SCCM) | BrF5 concentration (vol %) | HF flow rate (SCCM) | HF concentration (vol %) | Pressure (Torr) | Observed results at the inner portion of piping |
|---|---|---|---|---|---|---|
| Example 13 | 50 | 5 | 950 | 95 | 100 | Accumulated material completely removed to no metal corrosion |
| Example 14 | 100 | 10 | 900 | 90 | 100 | Same results as in Example 13 |

[TABLE 3]-continued

| | BrF5 flow rate (SCCM) | BrF5 concentration (vol %) | HF flow rate (SCCM) | HF concentration (vol %) | Pressure (Torr) | Observed results at the inner portion of piping |
|---|---|---|---|---|---|---|
| Example 15 | 200 | 20 | 800 | 80 | 100 | Same as in Example 13 |
| Comparative Example 5 | 300 | 30 | 700 | 70 | 100 | Piping temperature raised to 150° C. Metal corroded and which powder formed |

Examples 16 to 18, Comparative Example 6

In an exhaust series piping and at the flange portion of a reactor of an apparatus in which thermal CVD (a flow rate: 3SLM, 450° C., 760 Torr) was carried out using PETa as a starting material, a transparent glass state (accumulated film thickness, about 5 mm) substance containing a liquid alkoxide polymerized material was adhered. As a result of an elemental analysis, the composition was $TaC_{0.2}H_8O_{10}$. This piping portion was detached, and a gas supplying series and a gas exhausting series piping were newly attached to the piping. A mixed gas of $ClF_3$ and HF was flowed with a whole pressure of 760 Torr for one hour to effect cleaning. Observed results in the piping after cleaning are shown in Table 4. Also, when the $ClF_3$ gas had been changed to $F_2$, $BrF_5$ or $IF_7$, the same results were obtained.

[TABLE 4]

| | ClF3 flow rate (SCCM) | ClF3 concentration (vol %) | HF flow rate (SCCM) | HF concentration (vol %) | Pressure (Torr) | Observed results at the inner portion of piping |
|---|---|---|---|---|---|---|
| Example 16 | 50 | 5 | 950 | 95 | 100 | Accumulated material completely removed to no metal corrosion |
| Example 17 | 100 | 10 | 900 | 90 | 100 | Same results as in Example 16 |
| Example 18 | 200 | 20 | 800 | 80 | 100 | Same as in Example 16 |
| Comparative Example 6 | 300 | 30 | 700 | 70 | 100 | Piping temperature raised to 150° C. Metal corroded and which powder formed |

With the thus arranged cleaning gas according to the present invention, cleaning can be easily carried out without damaging a thin film forming apparatus, piping, etc.

The entire contents of Japanese Patent Applications No. 11-289190 filed on Oct. 12, 1999 in Japan are incorporated herein by reference.

What is claimed is:

1. A cleaning gas for removing an accumulated material formed on an inner surface of a thin film forming apparatus by thermal decomposition of alkoxide, said cleaning gas comprising:

HF gas; and at least one of an oxygen-containing gas, a fluorine gas, a chlorine fluoride gas, a bromine fluoride gas and an iodine fluoride gas.

2. A cleaning gas as claimed in claim 1, wherein the oxygen-containing gas includes one of $O_2$, $O_3$, $N_2O$, NO and CO, the chlorine fluoride gas including one of ClF, $ClF_3$ and $ClF_5$, the bromine fluoride gas including one of BrF, $BrF_3$ and $BrF_5$, and the iodine fluoride gas including one of IF, $IF_3$, $IF_5$ and $IF_7$.

3. A cleaning gas as claimed in claim 1, wherein when the oxygen-containing gas is used, the gas concentration is in the range of 5 to 80%, and the HF gas concentration is in the range of 10 to 95%.

4. A cleaning gas as claimed in claim 1, wherein the temperature of cleaning is in the range of 20 to 200° C.

5. A cleaning gas as claimed in claim 1, wherein when one of fluorine, chlorine fluoride, bromine fluoride and iodine fluoride is used, the concentration of the gas is smaller than or equal to 20%, and the HF gas concentration is in the range of 5 to 99.9%.

6. A cleaning gas for removing an accumulated material formed on an inner surface of a thin film forming apparatus by thermal decomposition of pentaethoxytantalum, said cleaning gas comprising:

HF gas; and at least one of an oxygen-containing gas, a fluorine gas, a chlorine fluoride gas, a bromine fluoride gas and an iodine fluoride gas.

7. A cleaning gas for removing an accumulated material formed on an inner surface of a thin film forming apparatus by thermal decomposition of tetraethoxysilane, said cleaning gas comprising:

HF gas; and at least one of an oxygen-containing gas, a fluorine gas, a bromine fluoride gas and an iodine fluoride gas.

8. A cleaning as claimed in claim 7, further comprising an inert gas which includes one of Ar, He, $N_2$ and $CO_2$.

* * * * *